United States Patent [19]

Zimmer

[11] Patent Number: 4,910,383

[45] Date of Patent: Mar. 20, 1990

[54] HEATED TOOL WITH DIFFERENTLY SIZED AND SHAPED HEATING AREAS

[75] Inventor: Gero Zimmer, Munich, Fed. Rep. of Germany

[73] Assignee: Productech Reflow Solder Equipment Inc., Rolling Hills Estates, Calif.

[21] Appl. No.: 215,631

[22] Filed: Jul. 6, 1988

[30] Foreign Application Priority Data

Jul. 9, 1987 [DE] Fed. Rep. of Germany ....... 3722765

[51] Int. Cl.⁴ ............................................. B23K 35/12
[52] U.S. Cl. ................................. 219/233; 219/85.16; 228/180.1
[58] Field of Search .................... 219/85 D, 228, 229, 219/233, 235, 243, 85.16; 156/583.1, 583.2, 583.4; 228/178, 179, 180.1, 44.7; 29/837, 839, 840, 843

[56] References Cited

U.S. PATENT DOCUMENTS 4,090,656  5/1978  Sato et al. .................. 228/180.1
4,220,845  9/1980  Morreale ....................... 219/243
4,255,644  3/1981  Delorme ....................... 219/233

OTHER PUBLICATIONS

"Three-Legged Solder Reflow Bonding Tip", by Houser, *IBM Technical Disclosure Bulletin*, pp. 69, 70, Vol. 22, No. 1, June, 1979.

Primary Examiner—A. D. Pellinen
Assistant Examiner—Geoffrey S. Evans
Attorney, Agent, or Firm—Notaro & Michalos

[57] ABSTRACT

A heated tool comprises a one piece tool member having a plurality of bar portions with different cross sections. A single current path is defined through the bar portions for heating various areas of the bar portions to different extents. Advantageously, one or more U-shaped heating bars can be defined in the single tool member.

10 Claims, 1 Drawing Sheet

HEATED TOOL WITH DIFFERENTLY SIZED AND SHAPED HEATING AREAS

FIELD AND BACKGROUND OF THE INVENTION

The present invention relates in general to heated tools, and in particular to a new and useful heated tool having a plurality of heating areas which are different shapes and which can be supplied with different amounts of heat. The heating tools may either be moved to the objects to be treated or mounted in a fixed position, with the objects to be treated being brought to the heated tool.

Thermal energy is either supplied to the objects to be treated (e.g. to connect the to each other), by radiant heating from heated surfaces of the tool, or by direct thermal contact between the heated tool and the object. A controlled force is usually applied against the object by the heated tool. An additional thermal conductive material may be used to increase heat flow from the heated tool to the object. Flux, for example, may be provided for increasing the transfer of heat and for reducing oxidation during the thermal process.

Such tools may supply heat either continuously or during selected time periods only. Heat may be applied during heating pulses which may be activated or controlled by various external conditions, for example, by forcing the heated tool against the object to be heated or connected.

Various sources of heat are known for heating the heated tool to a variety of selected temperatures. Hot gases and/or electric current for example may be used for heating specified heat supplying areas or surfaces of the tool.

For the present invention, it is preferable to utilize the flow of electrical current through a heated tool for heating the tool. This permits controlled pulse-heating featuring fast heating rates as well as precise temperature control at various areas of the tool.

A known generally U-shaped heated tool is disclosed in German Patent reference 2,848,519. This heated tool is mounted to holders either using screws or by welding. This keeps the heat supplying areas of the tool in position and further is used to provide electrical connectors for feeding electrical heating current to the tool. Such tools can be manufactured using sheet metal designs (see German Patents 3,144,048.7, 3,137,859.5 and 3,137,860.9 to the present inventor). These heated tools can also be machined from solid materials.

When transferring thermal energy to one or more objects using one or more heated tools, excess heat and relatively long periods of time are sometimes needed, particularly when the objects are made of materials having high thermal loads.

The use of force-controlled thermal contact for transferring thermal energy from a tool to a part must also be accurately controlled. For this reason force-controlled thermal contact has limited applications. Objects having high thermal conductivity, for example objects made of metal oxides, require different procedures. Continuous preheating for example may be necessary for such applications. A heating tool is simply set at a much higher temperature to compensate for thermal loads. This has limitations however in that excess heat may be damaging to some materials.

SUMMARY OF THE INVENTION

An object of the present invention is to provide a substantially one piece heated tool which defines a contiguous current path having a plurality of contiguous bar portions. At least two of the bar portions have different cross sections so as to be heated by different amounts as the current passes along the current path. Heating surfaces are provided on at least some of the bar surfaces for heating different objects. In this way a one piece heated tool can be provided with multiple heating surfaces which can be heated to different extents and by different amounts.

A further object of the present invention is to define a plurality of substantially U-shaped heater bars on a single tool member which is supplied with current along a single current path.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
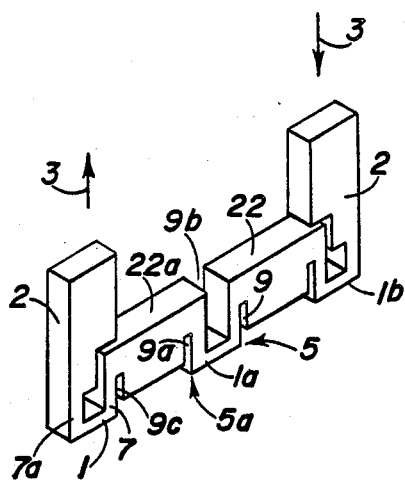
FIG. 1 is a perspective view of a heated tool formed of a single tool member in accordance with the invention.

Referring to the drawings in particular, the invention embodied in FIG. 1 comprises a heated tool of one piece construction, defining a plurality of heating bar portions 1, 1a and 1b for heating objects.

Electrical current is supplied in the direction of arrows 3, 3 through holding bar portions, 2, 2 and connecting bar portions 22, 22a, to supply current through the heating bar portions 1, 1a and 1b. The cross section of the different bar portions can be selected to create different thermal conditions through the one piece tool member. Electrical current passing through smaller cross sectioned bar portions experiences more resistance and thus heats that bar portion to a greater extent.

Each of the heating bar portions is supported by mechanical and thermal support bar portions 7, 7a. The various bar portions can be formed in a convenient manner by cutting slots 9, 9a, 9b and 9c, in the tool member. Heating bar portion 1a for example is defined between minor slots, 9a and 9 which separate the heating bar portion 1a from adjacent connecting bar portions 22a and 22, and a major slot 9b. This defines a U-shaped heating bar having support bar portions 5, 5a and a heating bar portion 1a. Additional slots define the two additional U-shaped heating bars 1 and 1b. The cross section of the heating bars can be selected for different thermal and mechanical requirements. The holding and connecting bar portions 2 22 and 22a, can be kept relatively "cold" by providing them with larger cross sections. This also improves their mechanical stability. This is particularly useful when pulse-heating by supplying pulses of electric current through the heated tool.

In this way a one piece tool member includes a plurality of contiguous bar portions which define a single current path while having multiple heating surfaces which can be heated to different extents.

Figure 2:
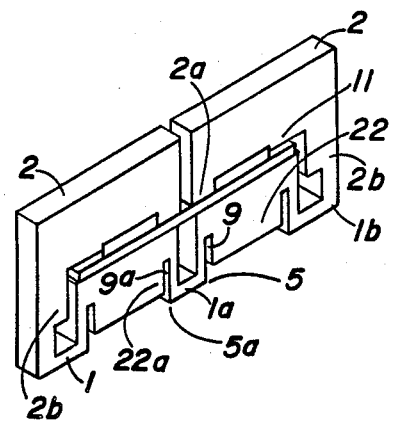
FIG. 2 is a view similar to FIG. 1 of a second embodiment of the invention.

FIG. 2 shows another embodiment of the invention wherein the same numerals are used to designate the same or similar parts. Heating bar portions 1, 1a and 1b having mechanical and thermal support bar portions shown for example at 5, 5a, lie on the single electrical current path. Holding bar portions 2, 2 are enlarged to extend above the connecting bar portions 22, 22a. A mechanical support 11 made of electrically insulating material mechanically engages the facing surfaces of the holding and connecting bar portions to increase the amount of mechanical force which can be applied to the tool member. To this end, the holding bar portions 2 each have an end buttress 2b which is aligned with one of the mechanical and thermal support bar portion of each of the heating bar portions 1 and 1b. The parts of the holding bar portions 2 which extend over the connecting bar portions 22, 22a, are likewise provided with projections 2a which align with the remaining support bar portions of the outer heating bar portions 1 and 1b, and two support bar portions 5, 5a, of the central heating bar portion 1a.

Figure 3:
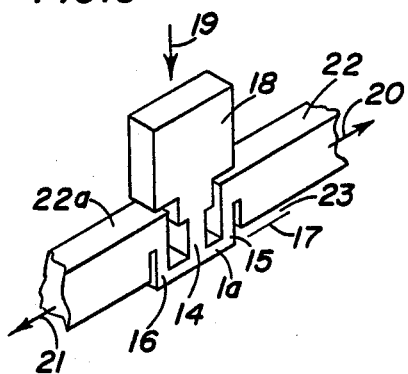
FIG. 3 is a fragmentary view similar to FIG. 1 of a still further embodiment of the invention.

FIG. 3 shows another embodiment of the invention wherein the heating bar portion 1a is supported by end support bars 15, 16 and an intermediate support bar 14. Current is advantageously supplied through a holding bar 18 in the direction of arrow 19. The current passes through the intermediate support bar 14 and then divides toward opposite sides of the heating bar portion 1a, through the support bars 15 and 16 and out through the connecting bars 22, 22a, in the direction of arrows 20 and 21. By selecting the cross sections of the connecting bars 15 and 16, different amounts of the resistive heating can be provided in heating bar portion 1a on opposite sides of the intermediate support 14. Conversely, current can be supplied in the direction opposite arrows 19, 20 and 21. In either case, a single current path is provided in the single tool member to define multiple heating areas which can produce different thermal conditions.

The heating surface of heating bar portion 1a lies in a plane 17 which can be spaced by a selected amount 23 from the connecting bars 22 or 22a. The amount can be selected so that the connecting bars act as a hold-down structure for holding down an object to be heated by the heating bar portion 1a during a heating cycle, while applying force to the component. Since the temperature of the connecting bars can be different and advantageously lower than the heating bar portion 1a, potential damage to the component is avoided.

Figure 4:
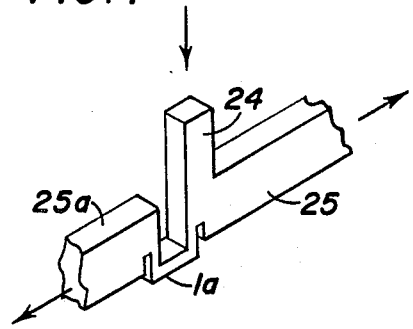
FIG. 4 is a view similar to FIG. 3 of a still further embodiment of the invention.

FIG. 4 shows another embodiment of the invention wherein one support bar of the heating bar portion 1a has a holder/support 24 thereover which can be supplied with current. This produces a heating bar with less thermal mass and without any additional thermal influence. The cross section of the connecting bars 25 and 25a can also be selected and changed to accurately taylor the amount of heating current which passes through the heating bar portion 1a.

While the specific embodiments of the invention have been shown and described in detail to illustrate the application of the principles of the invention, it will be understood that the invention may be embodied otherwise without departing from such principles.

What is claimed is:

1. A heated tool for heating at least one object, comprising a plurality of contiguous current passing bar portions defining a contiguous path for the resistive heating of at least some of the bar portions, at least some of said bar portions having different cross sections for passing different amounts of current and being resistively heated by different amounts, at least one of said bar portions comprising an connecting bar portion having a relatively large cross section, and at least one of said bar portions comprising a heating bar portion having a relatively small cross section, said heating bar portion carrying a heating surface lying in a plane which is offset by a selected spacing from said connecting bar portion whereby said connecting bar portion acts as a relatively cool holding device for a component to be heat treated by said heating surface.

2. A tool according to claim 1 wherein at least some of said bar portions have different mechanical dimensions and different thermal masses.

3. A heated tool for heating at least one object, comprising a plurality of contiguous current passing bar portions defining a contiguous path for the resistive heating of at least some of the bar portions, at least some of said bar portions having different cross sections for passing different amounts of current and being resistively heated by different amounts, said plurality of contiguous bar portions being formed as a single one piece mechanical unit; and a plurality of slots cut into said unit and defining at least two heating bar portions therebetween, each heating bar portion carrying a heating surface for heating an object.

4. A tool according to claim 3 wherein at least some of said slots define a pair of support bar portions connected to opposite ends of each of said heating bar portions for defining a plurality of U-shaped heating bars.

5. A tool according to claim 4 wherein at least two of said bar portions comprise holding bar portions for connection to a source of current, and at least one connecting bar portion connected between said heating bar and at least one of said holding bar portions for passing current from said at least one holding bar portion to said heating bar, said connecting bar portion having a larger cross section than said heating bar portion.

6. A tool according to claim 3 wherein at least some of said bar portions have different mechanical dimensions and different thermal masses.

7. A heated tool for heating at least one object, comprising a plurality of contiguous current passing bar portions defining a contiguous path for the resistive heating of at least some of the bar portions, at least some of said bar portions having different cross sections for passing different amounts of current and being resistively heated by different amounts, said bar portions including a heating bar portion having end support bar portions on opposite sides thereof, and an intermediate support bar portion, intermediate said end support bar portions and a connecting bar portion connected to each of said end and intermediate support bar portions for passing current to and from said heating bar portion.

8. A tool according to claim 7 wherein at least some of said bar portions have different mechanical dimensions and different thermal masses.

9. A heated tool for heating at least one object, comprising a plurality of contiguous current passing bar portions defining a contiguous path for the resistive heating of at least some of the bar portions, at least some of said bar portions having different cross sections for passing different amounts of current and being resistively heated by different amounts, said bar portions including at least one U-shaped heating bar comprising a pair of support bars connected to a heating bar.

10. A tool according to claim 9 wherein at least some of said bar portions have different mechanical dimensions and different thermal masses.

* * * * *